United States Patent
Yonak et al.

(10) Patent No.: US 11,622,479 B2
(45) Date of Patent: Apr. 4, 2023

(54) LIQUID COOLED TERMINAL BLOCK ASSEMBLIES

(71) Applicant: FORD GLOBAL TECHNOLOGIES, LLC, Dearborn, MI (US)

(72) Inventors: Serdar Hakki Yonak, Ann Arbor, MI (US); Fan Wang, Novi, MI (US); Baoming Ge, Okemos, MI (US); Moon Young Lee, Livonia, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 86 days.

(21) Appl. No.: 17/083,934

(22) Filed: Oct. 29, 2020

(65) Prior Publication Data
US 2022/0142012 A1   May 5, 2022

(51) Int. Cl.
| | |
|---|---|
| *H05K 5/03* | (2006.01) |
| *H05K 7/20* | (2006.01) |
| *H01R 9/24* | (2006.01) |
| *H05K 5/00* | (2006.01) |
| *B60R 16/02* | (2006.01) |

(52) U.S. Cl.
CPC .......... *H05K 7/20927* (2013.01); *H01R 9/24* (2013.01); *H05K 5/0008* (2013.01); *H05K 5/03* (2013.01); *B60R 16/02* (2013.01)

(58) Field of Classification Search
CPC .... H05K 7/20927; H05K 5/0008; H05K 5/03; H01R 9/24; B60R 16/02
See application file for complete search history.

(56) References Cited

U.S. PATENT DOCUMENTS

| | | | | |
|---|---|---|---|---|
| 7,952,875 | B2* | 5/2011 | Woody | H05K 7/20927 361/699 |
| 7,978,471 | B2* | 7/2011 | Tokuyama | H01L 23/49517 165/80.4 |
| 8,064,234 | B2* | 11/2011 | Tokuyama | H05K 7/20927 363/141 |
| 8,115,351 | B2 | 2/2012 | Reinhart et al. | |
| 8,362,665 | B2 | 1/2013 | Chamberlin et al. | |
| 8,391,008 | B2* | 3/2013 | Dede | H05K 7/20927 361/689 |
| 8,699,254 | B2* | 4/2014 | Nishikimi | H05K 7/20927 363/141 |
| 8,803,378 | B2 | 8/2014 | Sonohara et al. | |
| 9,198,332 | B2* | 11/2015 | Osada | H01L 24/37 |

(Continued)

FOREIGN PATENT DOCUMENTS

| | | | |
|---|---|---|---|
| JP | 2013115952 A | * | 6/2013 |
| JP | 5760995 B2 | | 8/2015 |

(Continued)

*Primary Examiner* — Abhishek M Rathod
*Assistant Examiner* — Keith DePew
(74) *Attorney, Agent, or Firm* — David B. Kelley; Carlson, Gaskey & Olds, P.C.

(57) ABSTRACT

This disclosure is directed to power systems for transferring power between electrical components. An exemplary power system includes a first electrical component (e.g., an electric motor), a second electrical component (e.g., an inverter system), and a terminal block assembly adapted to electrically couple the first and second electrical components. The terminal block assembly includes an internal cooling channel configured to receive coolant for providing direct liquid cooling of the bus bar.

18 Claims, 4 Drawing Sheets

(56) References Cited

U.S. PATENT DOCUMENTS

| | | | |
|---|---|---|---|
| 9,867,319 B2* | 1/2018 | Lei | H02M 7/003 |
| 10,186,979 B2* | 1/2019 | Harada | H05K 7/1432 |
| 10,405,466 B1* | 9/2019 | Pradeepkumar | H01L 23/4006 |
| 10,594,230 B2* | 3/2020 | Chung | H05K 7/20927 |
| 10,637,224 B2* | 4/2020 | Hiramitsu | H02G 5/10 |
| 10,862,371 B2* | 12/2020 | Geither | H02K 5/225 |
| 2010/0302733 A1* | 12/2010 | Woody | H01L 23/473 |
| | | | 361/689 |
| 2014/0198449 A1* | 7/2014 | Osada | H05K 7/20927 |
| | | | 361/689 |
| 2016/0324039 A1* | 11/2016 | Souda | E02F 9/0866 |
| 2017/0347484 A1* | 11/2017 | Lei | B60K 6/543 |
| 2019/0214805 A1* | 7/2019 | Hiramitsu | H02G 5/10 |
| 2019/0296656 A1* | 9/2019 | Chung | H05K 7/20927 |
| 2019/0343019 A1* | 11/2019 | Todorovic | H05K 7/20927 |
| 2020/0154588 A1* | 5/2020 | Su | H05K 5/006 |
| 2020/0169147 A1* | 5/2020 | Söhnle | H02K 9/19 |
| 2021/0259142 A1* | 8/2021 | Schmitt | H05K 7/20927 |
| 2021/0391236 A1* | 12/2021 | Tsuyuno | H01L 25/50 |
| 2022/0094238 A1* | 3/2022 | Ziskovsky | B60K 6/26 |

FOREIGN PATENT DOCUMENTS

| | | | |
|---|---|---|---|
| JP | 2019003893 A | * | 1/2019 |
| KR | 101462937 B1 | * | 11/2014 |

* cited by examiner

LIQUID COOLED TERMINAL BLOCK ASSEMBLIES

TECHNICAL FIELD

This disclosure relates to power systems, and more particularly to power systems that include liquid cooled terminal block assemblies.

BACKGROUND

In general, electrified vehicles differ from conventional motor vehicles because they are selectively driven by one or more battery powered electric motors. Conventional motor vehicles, by contrast, rely exclusively on the internal combustion engine to propel the vehicle.

A high voltage battery pack typically powers the electric motor of the electrified vehicle. An inverter system converts direct current (DC) power from the high voltage battery pack to alternating current (AC) power for powering the electric motor. A bus bar assembly electrically typically couples the inverter system to the electric motor for outputting AC power to the electric motor.

SUMMARY

A power system according to an exemplary aspect of the present disclosure includes, among other things, a first electrical component, a second electrical component, and a terminal block assembly adapted to electrically couple the first electric component to the second electrical component. The terminal block assembly includes a case body, a bus bar extending through the case body, a cover securable to the case body, and a cooling channel arranged between the case body and the cover. The cooling channel is configured for circulating a coolant for cooling the bus bar.

In a further non-limiting embodiment of the foregoing power system, the first electrical component is an electric motor and the second electrical component is an inverter system.

In a further non-limiting embodiment of either of the foregoing power systems, the cover includes a plateaued surface that protrudes from an inner surface of the cover.

In a further non-limiting embodiment of any of the foregoing power systems, the plateaued surface contacts a dividing tab of the case body when the cover is secured to the case body.

In a further non-limiting embodiment of any of the foregoing power systems, the plateaued surface establishes a recess in an outer surface of the cover, and a screw hole is formed in the recess.

In a further non-limiting embodiment of any of the foregoing power systems, the screw hole of the recess aligns with another screw hole formed in the case body.

In a further non-limiting embodiment of any of the foregoing power systems, the plateaued surface forms a concavity at the inner surface of the cover, and the concavity establishes at least a portion of the cooling channel when the cover is secured to the case body.

In a further non-limiting embodiment of any of the foregoing power systems, the case body includes at least one mounting tab for mounting the terminal block assembly to the first electrical component, the second electrical component, or both.

In a further non-limiting embodiment of any of the foregoing power systems, the bus bar is received in a slot of the case body.

In a further non-limiting embodiment of any of the foregoing power systems, a tab of the cover extends into the slot and establishes an outlet nozzle between the cover and the bus bar when the cover is secured to the case body.

In a further non-limiting embodiment of any of the foregoing power systems, the cooling channel is part of a closed thermal loop that includes an inlet port located on the cover, an outlet port located on the cover, a pump, and a heat exchanger.

In a further non-limiting embodiment of any of the foregoing power systems, the cover includes an inlet port configured to direct the coolant into the cooling channel.

In a further non-limiting embodiment of any of the foregoing power systems, the coolant exits the cooling channel through a plurality of outlet nozzles arranged between the cover and the case body.

In a further non-limiting embodiment of any of the foregoing power systems, the plurality of outlet nozzles are arranged on a bottom side of the case body.

An electrified vehicle may include a power system having a first electrical component, a second electrical component, and a terminal block assembly adapted to electrically couple the first electric component to the second electrical component. The terminal block assembly includes a case body, a bus bar extending through the case body, a cover securable to the case body, and a cooling channel arranged between the case body and the cover. The cooling channel is configured for circulating a coolant for cooling the bus bar.

A method according to another exemplary aspect of the present disclosure includes, among other things, communicating a coolant into an inlet port of a cover of a housing of a terminal block assembly, directing the coolant from the inlet port to a cooling channel located inside the housing, and circulating the coolant through the cooling channel to remove heat from a bus bar of the terminal block assembly. The coolant directly contacts the bus bar during the circulating.

In a further non-limiting embodiment of the foregoing method, the coolant includes oil.

In a further non-limiting embodiment of either of the foregoing methods, the method includes expelling the coolant from the cooling channel through a plurality of outlet nozzles established by the housing.

In a further non-limiting embodiment of any of the foregoing methods, the method includes expelling the coolant from the cooling channel through an outlet port of the cover.

In a further non-limiting embodiment of any of the foregoing methods, the inlet port, the outlet port, a pump, and a heat exchanger are part of a closed thermal loop adapted for cooling the bus bar.

The embodiments, examples, and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

The various features and advantages of this disclosure will become apparent to those skilled in the art from the following detailed description. The drawings that accompany the detailed description can be briefly described as follows.

DETAILED DESCRIPTION

This disclosure is directed to power systems for transferring power between electrical components. An exemplary power system includes a first electrical component (e.g., an electric motor), a second electrical component (e.g., an inverter system), and a terminal block assembly adapted to electrically couple the first and second electrical components. The terminal block assembly includes an internal cooling channel configured to receive coolant for providing direct liquid cooling of the bus bar. These and other features of this disclosure are described in greater detail below.

Figure 1:
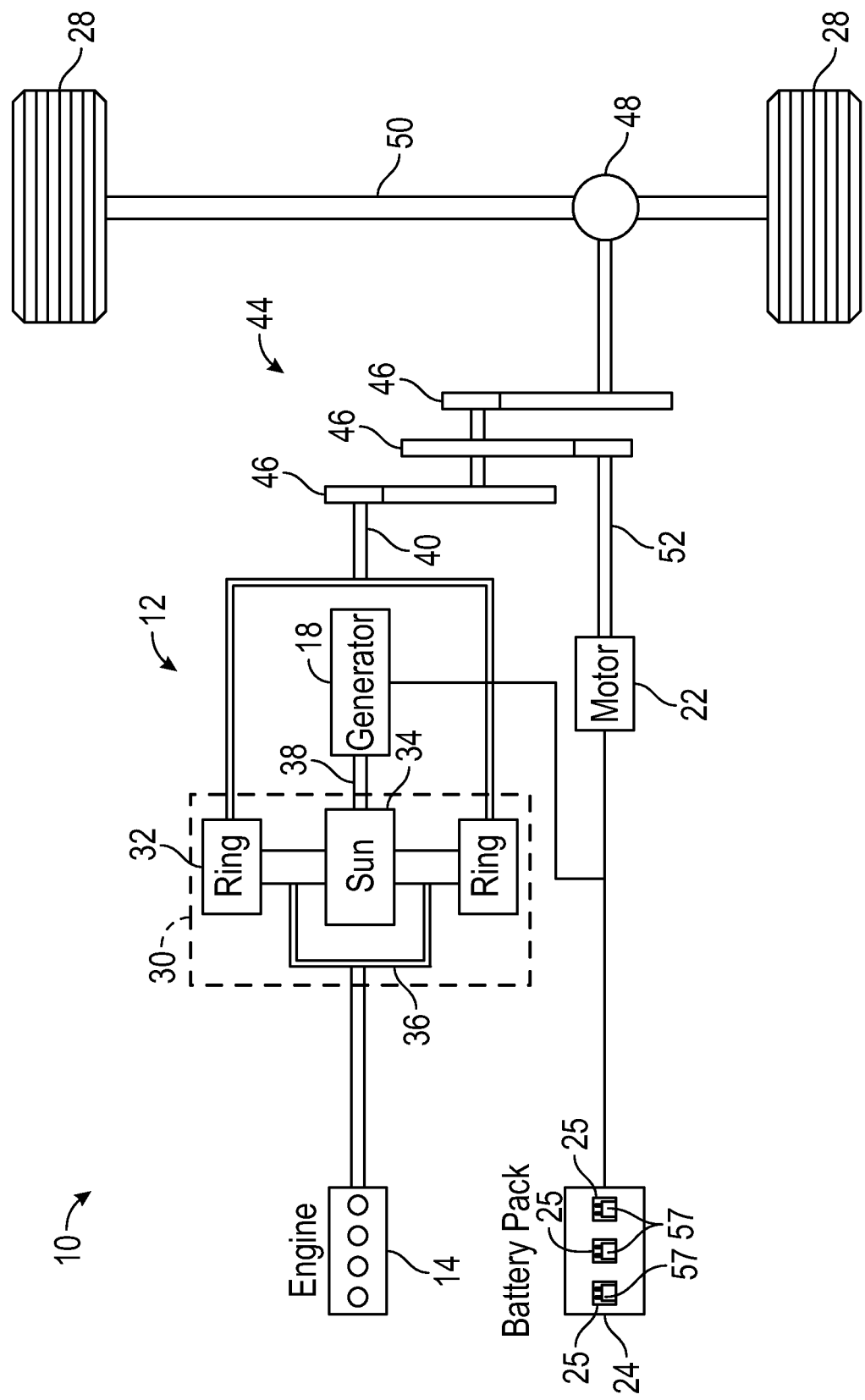
FIG. 1 schematically illustrates a powertrain of an electrified vehicle.

FIG. 1 schematically illustrates a powertrain 10 for an electrified vehicle 12. Although depicted as a hybrid electric vehicle (HEV), it should be understood that the concepts described herein are not limited to HEVs and could extend to other electrified vehicles, including, but not limited to, plug-in hybrid electric vehicles (PHEVs), battery electric vehicles (BEVs), fuel cell vehicles, etc.

In an embodiment, the powertrain 10 is a power-split powertrain system that employs first and second drive systems. The first drive system includes a combination of an engine 14 and a generator 18 (i.e., a first electric machine). The second drive system includes at least a motor 22 (i.e., a second electric machine), the generator 18, and a battery pack 24. In this example, the second drive system is considered an electric drive system of the powertrain 10. The first and second drive systems are each capable of generating torque to drive one or more sets of vehicle drive wheels 28 of the electrified vehicle 12. Although a power-split configuration is depicted in FIG. 1, this disclosure extends to any hybrid or electric vehicle including full hybrids, parallel hybrids, series hybrids, mild hybrids, or micro hybrids.

The engine 14, which may be an internal combustion engine, and the generator 18 may be connected through a power transfer unit 30, such as a planetary gear set. Of course, other types of power transfer units, including other gear sets and transmissions, may be used to connect the engine 14 to the generator 18. In a non-limiting embodiment, the power transfer unit 30 is a planetary gear set that includes a ring gear 32, a sun gear 34, and a carrier assembly 36.

The generator 18 can be driven by the engine 14 through the power transfer unit 30 to convert kinetic energy to electrical energy. The generator 18 can alternatively function as a motor to convert electrical energy into kinetic energy, thereby outputting torque to a shaft 38 connected to the power transfer unit 30. Because the generator 18 is operatively connected to the engine 14, the speed of the engine 14 can be controlled by the generator 18.

The ring gear 32 of the power transfer unit 30 may be connected to a shaft 40, which is connected to vehicle drive wheels 28 through a second power transfer unit 44. The second power transfer unit 44 may include a gear set having a plurality of gears 46. Other power transfer units may also be suitable. The gears 46 transfer torque from the engine 14 to a differential 48 to ultimately provide traction to the vehicle drive wheels 28. The differential 48 may include a plurality of gears that enable the transfer of torque to the vehicle drive wheels 28. In a non-limiting embodiment, the second power transfer unit 44 is mechanically coupled to an axle 50 through the differential 48 to distribute torque to the vehicle drive wheels 28.

The motor 22 can also be employed to drive the vehicle drive wheels 28 by outputting torque to a shaft 52 that is also connected to the second power transfer unit 44. In a non-limiting embodiment, the motor 22 and the generator 18 cooperate as part of a regenerative braking system in which both the motor 22 and the generator 18 can be employed as generators to output electrical power. For example, the motor 22 and the generator 18 can each output electrical power to the battery pack 24.

The battery pack 24 is an exemplary electrified vehicle battery. The battery pack 24 may be a high voltage traction battery pack that includes a plurality of battery arrays 25 (i.e., battery assemblies or groupings of battery cells 57) capable of outputting electrical power to operate the motor 22, the generator 18, and/or other electrical loads of the electrified vehicle 12 for providing power to propel the wheels 28. Other types of energy storage devices and/or output devices could also be used to electrically power the electrified vehicle 12.

Figure 2:
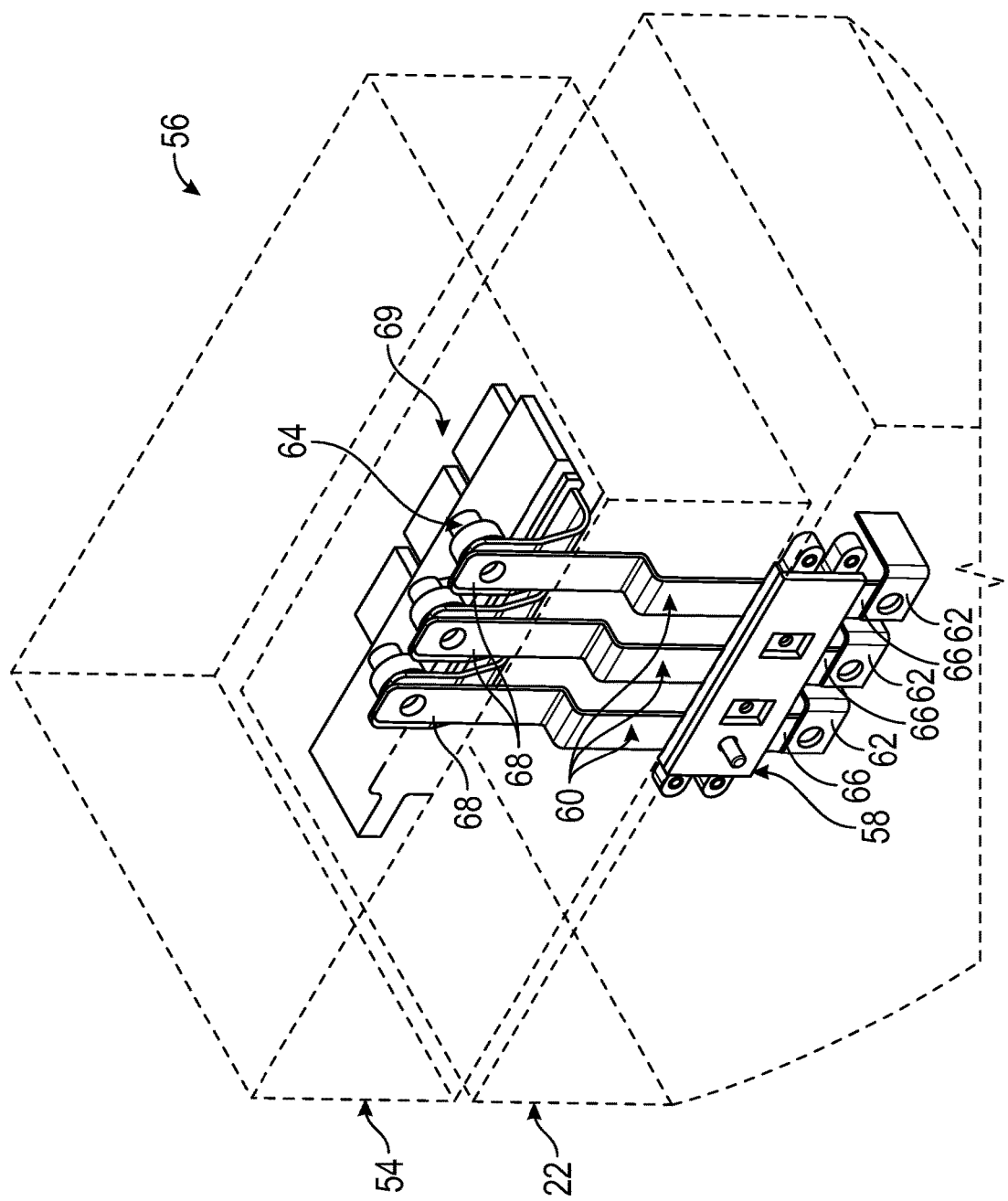
FIG. 2 illustrates a power system of an electrified vehicle.

FIG. 2 schematically illustrates a power system 56. The power system 56 could be part of the powertrain 10 of the electrified vehicle 12 of FIG. 1. However, the teachings of this disclosure may be applicable to any power system for any application.

In an embodiment, the power system 56 includes an electric motor 22 (i.e., a first electrical component), an inverter system 54 (i.e., a second electrical component), which is sometimes referred to as an inverter system controller (ISC), and a terminal block assembly 58. The terminal block assembly 58 electrically couples the electric motor 22 to the inverter system 54 in order to output AC power for powering the electric motor 22. For example, the inverter system 54 may receive DC power from a battery pack or some other power source and may convert the DC power to three-phase AC power. The AC power is carried to the electric motor 22 by the terminal block assembly 58 for powering the electric motor 22.

Although this disclosure describes electrically coupling an electric motor and an inverter system, the terminal block assemblies of this disclosure could be used to electrically couple any electrical components that operate over an alternating current bus within a power system.

The terminal block assembly 58 includes a plurality of bus bars 60 for electrically connecting the inverter system 54 and the electric motor 22. In the illustrated embodiment, the inverter system 54 is configured to provide a three-phase output to the electric motor 22 and thus the terminal block assembly 58 include a total of three bus bars 60. However, the total number of bus bars 60 is not intended to limit this disclosure, and thus a greater or fewer number of bus bars than are shown in the figures associated with this disclosure could be employed within the terminal block assembly 58.

In an embodiment, the bus bars 60 are made of a metallic material, such as copper, for example. However, other metallic materials may also be suitable and are thus also contemplated within the scope of this disclosure.

Motor stator leads 62, which are connected to windings of a motor stator of the electric motor 22, are connected to first end portions 66 of the bus bars 60, and second, opposite end portions 68 of the bus bars 60 are connected to a current sensor assembly 64 of the inverter system 54. The current sensor assembly 64 operably connects to busbar connections 69 to power module terminals of the inverter system 54.

The thermal performance of the terminal block assembly 58 can limit the current carrying capability of the bus bars 60. Due to its connection to the terminal block assembly 58, the thermal performance of the current sensor assembly 64 may be significantly affected by the terminal block assembly 58. It is therefore desirable to actively cool the bus bars 60 of the terminal block assembly 58. This disclosure thus describes liquid cooled terminal block assemblies that are capable of actively managing the heat generated by the bus bars 60 during operation of the power system 56.

Figure 3:
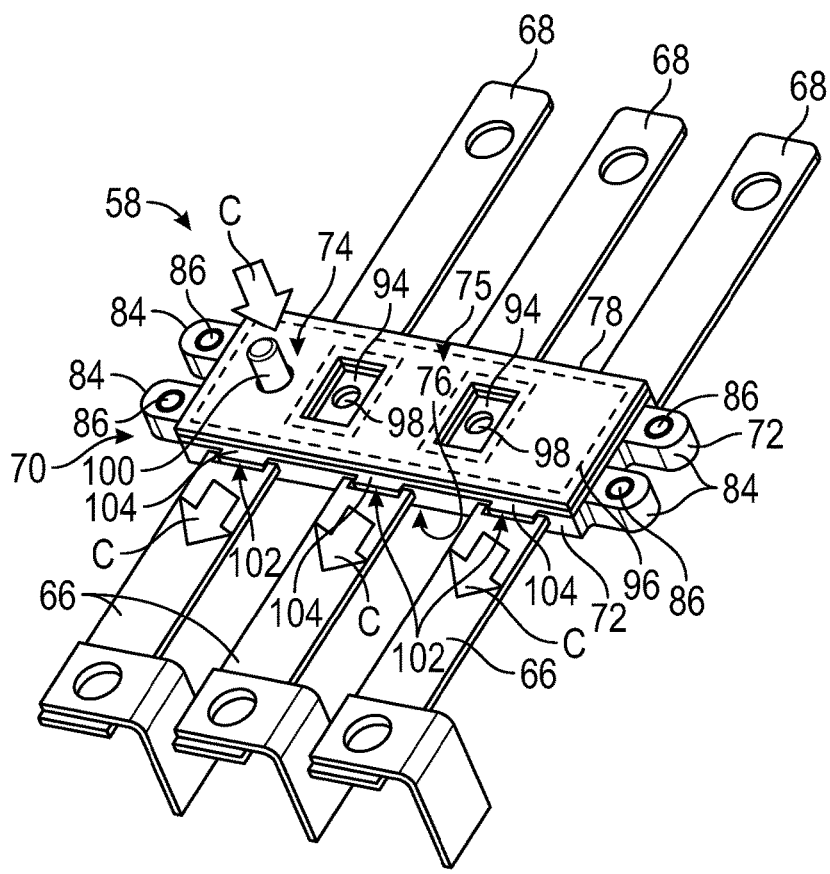
FIG. 3 illustrates a terminal block assembly according to an embodiment of this disclosure.
Figure 4:
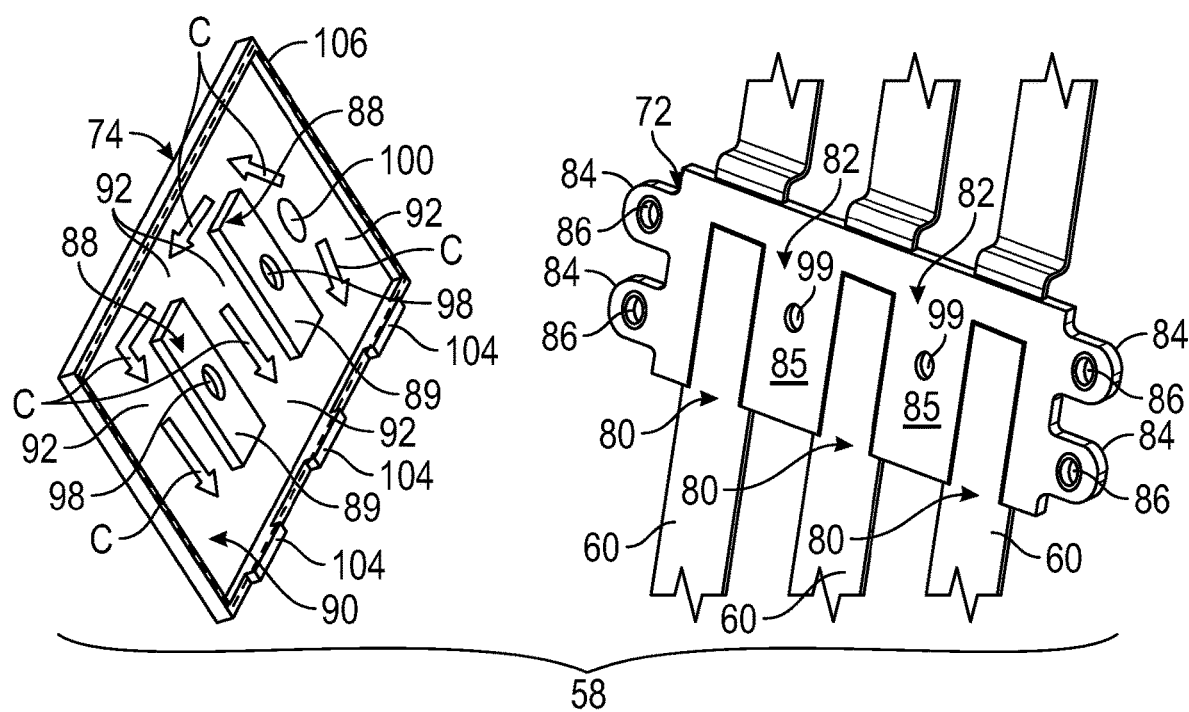
FIG. 4 is a partial exploded view of the terminal block assembly of FIG. 3.

FIGS. 3 and 4 illustrate an exemplary terminal block assembly 58 for use within a power system, such as the power system 56 of FIG. 2. The terminal block assembly 58 includes a two-piece housing 70 that receives portions of each of the bus bars 60. The first and second end portions 66, 68 of the bus bars 60 extend outside of the housing 70 for connection to the electric motor 22 and the inverter system 54, respectively. In an embodiment, the first end portions 66 of the bus bars 60 extend away from a bottom side 76 of the housing 70 and the second end portions 68 of the bus bars 60 extend away from a top side 78 of the housing 70.

The housing 70 of the terminal block assembly 58 may include a case body 72 and a cover 74 that is securable to the case body 72. The case body 72 and the cover 74 may be plastic components, in an embodiment. The case body 72 and the cover 74 may be manufactured via an injection molding technique or other suitable techniques.

The case body 72 of the housing 70 may include a plurality of slots 80 (best shown in FIG. 4). Each slot 80 is configured to receive one of the bus bars 60. A dividing tab 82 of the case body 72 may extend between adjacent slots of the plurality of slots 80.

The case body 72 may additionally include one or more mounting tabs 84. Each mounting tab 84 includes an opening 86 sized to receive a fastener (e.g., a bolt, screw, etc.) for mounting the terminal block assembly 58 to a housing of the electric motor 22 and/or the inverter system 54.

The cover 74 of the housing 70 may include two or more plateaued surfaces 88 (best shown in FIG. 4) that protrude inwardly from an inner surface 90 of the cover 74. The cover 74 may be positioned against the case body 72 such that flats 89 of the plateaued surfaces 88 contact flats 85 of the dividing tabs 82.

The plateaued surfaces 88 may form a concavity at the inner surface 90 of the cover 74. The concavity establishes a cooling circuit 75 inside the housing 70 when the cover 74 is secured to the case body 72. The cooling circuit 75 may include one or more interconnected cooling channels 92. The cooling channel 92 extend between the inner surface 90 of the cover 74 and the case body 72/bus bars 60 when the cover 74 is secured to the case body 72.

The configuration of the plateaued surfaces 88 may additionally form recesses 94 (best shown in FIG. 3) in an outer surface 96 of the cover 74. A screw hole 98 may be formed in each of the recesses 94. Each screw hole 98 is configured to receive a fastener (e.g., a bolt, screw, etc.) for mounting the cover 74 to the case body 72. Each dividing tab 82 of the case body 72 may also include a screw hole 99 that aligns with the screw holes 98 of the cover 74 for receiving the fasteners. The cover 74 could alternatively or additionally be ultrasonically welded to the case body 72.

An inlet port 100 may be provided on the cover 74 of the housing 70. The inlet port 100 is configured to receive and direct a coolant C (e.g., oil) into the cooling channels 92. As the coolant C circulates through the cooling channels 92, the coolant C picks up and takes away heat from the bus bars 60. The coolant C circulating within the cooling channels 92 may directly contact the bus bars 60, thereby ensuring high cooling performance during high current operation of the power system 56.

The coolant C may exit the cooling channels 92 through one or more outlet nozzles 102 of the housing 70. The outlet nozzles 102 may extend between tabs 104 of the cover 74 and the bus bars 60. The tabs 104 are positioned within the slots 80 of the case body 72 when the cover 74 is secured to the case body 72. The size, shape, and angle of the outlet nozzles 102 may be adjusted for controlling the flow of the coolant C, thereby optimizing cooling efficiency.

The coolant C that exits through the outlet nozzles 102 may be gravity fed down along the lengths of the first end portions 66 of the bus bars 60. The coolant C therefore increases the heat transfer at the first end portions 66 and further improves cooling performance of the bus bars 60. The coolant C may eventually accumulate at the bottom of the electric motor housing and can be pumped back to the inlet port 100 in an open thermal loop design.

A seal 106 (schematically shown in FIG. 4) may optionally be provided between the cover 74 and the case body 72 for sealing the interface therebetween. In an embodiment, the seal 106 is a gasket seal. However, other types of seals are also contemplated within the scope of this disclosure. Alternatively, the cover 74 could be ultrasonically welded to the case body 72, thereby negating the need for a separate seal.

Figure 5:
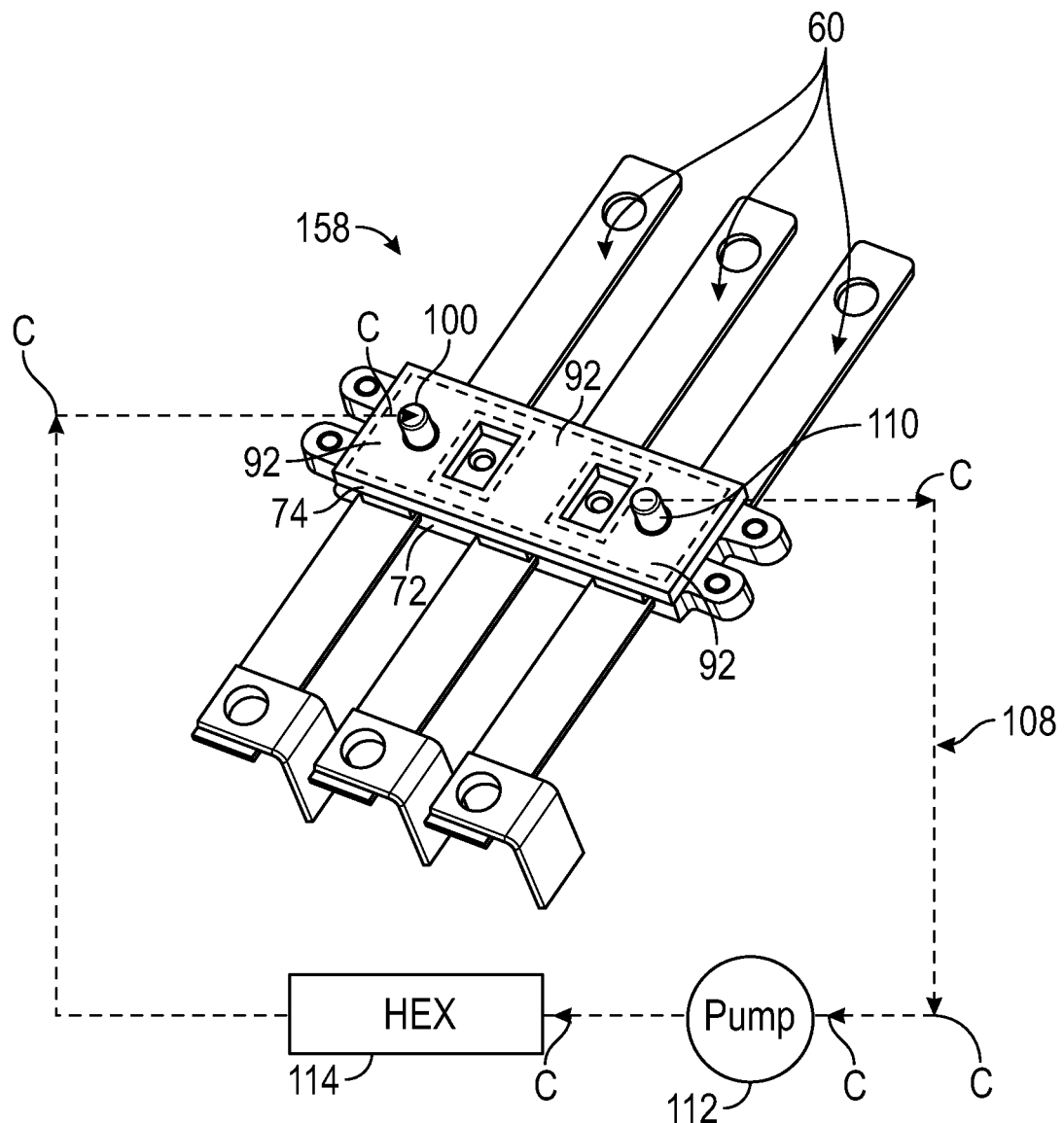
FIG. 5 illustrates a terminal block assembly according to another embodiment of this disclosure.

FIG. 5 illustrates another exemplary terminal block assembly 158. The terminal block assembly 158 is similar to the terminal block assembly 58 described above and illustrated in FIGS. 3-4. However, in this embodiment, the terminal block assembly 158 is configured to circulate the coolant C in a closed thermal loop 108.

For example, the coolant C may be introduced into the cooling channels 92 through the inlet port 100. The coolant C takes away heat from the bus bars 60 as it is circulated through the cooling channels 92. The coolant C may exit the cooling channels 92 through an outlet port 110 provided on the cover 74. In an embodiment, the outlet port 110 is provided on an opposite side of the cover 74 from the inlet port 100. However, other configurations may also be suitable and are therefore also contemplated within the scope of this disclosure.

A pump 112 may circulate the coolant C through the closed thermal loop 108. Coolant C exiting the outlet port 110 may be communicated through a heat exchanger 114 (e.g., a radiator). Thermal energy picked up by the coolant C from the bus bars 60 may be rejected to ambient air within the heat exchanger 114. The cooled coolant C may then be returned to the inlet port 100 for additional cooling.

The terminal block assemblies of this disclosure provide efficient and cost effective cooling of bus bars by using a direct liquid cooling scheme. The liquid cooling significantly improves the thermal performance of the bus bars and therefore enhances their current carrying capabilities. Active cooling of the terminal block assemblies is also beneficial for thermally managing nearby components such as current sensor assemblies within power systems.

Although the different non-limiting embodiments are illustrated as having specific components or steps, the embodiments of this disclosure are not limited to those particular combinations. It is possible to use some of the components or features from any of the non-limiting embodiments in combination with features or components from any of the other non-limiting embodiments.

It should be understood that like reference numerals identify corresponding or similar elements throughout the several drawings. It should be understood that although a particular component arrangement is disclosed and illustrated in these exemplary embodiments, other arrangements could also benefit from the teachings of this disclosure.

The foregoing description shall be interpreted as illustrative and not in any limiting sense. A worker of ordinary skill in the art would understand that certain modifications could come within the scope of this disclosure. For these reasons, the following claims should be studied to determine the true scope and content of this disclosure.

What is claimed is:

1. A power system, comprising:
   a first electrical component;
   a second electrical component; and
   a terminal block assembly adapted to electrically couple the first electric component to the second electrical component,
   wherein the terminal block assembly includes a case body, a bus bar extending through the case body, a cover securable to the case body, and a cooling channel arranged between the case body and the cover and configured for circulating a coolant for cooling the bus bar,
   wherein the bus bar is received in a slot of the case body,
   wherein a tab of the cover extends into the slot and establishes an outlet nozzle between the cover and the bus bar when the cover is secured to the case body.

2. The power system as recited in claim 1,
   wherein the cover includes a plateaued surface that protrudes from an inner surface of the cover,
   wherein the plateaued surface contacts a dividing tab of the case body when the cover is secured to the case body.

3. The power system as recited in claim 2, wherein the plateaued surface establishes a recess in an outer surface of the cover, and further comprising a screw hole formed in the recess.

4. The power system as recited in claim 3, wherein the screw hole of the recess aligns with another screw hole formed in the case body.

5. The power system as recited in claim 2, wherein the plateaued surface forms a concavity at the inner surface of the cover, and further wherein the concavity establishes at least a portion of the cooling channel when the cover is secured to the case body.

6. The power system as recited in claim 2, wherein the dividing tab is positioned between the bus bar and a second bus bar of the terminal block assembly.

7. The power system as recited in claim 2, wherein a first flat of the plateaued surface contacts a second flat of the dividing tab.

8. The power system as recited in claim 1, wherein the first electrical component is an electric motor and the second electrical component is an inverter system.

9. The power system as recited in claim 1, wherein the case body includes at least one mounting tab for mounting the terminal block assembly to the first electrical component, the second electrical component, or both.

10. The power system as recited in claim 1, wherein the cooling channel is part of a closed thermal loop that includes an inlet port located on the cover, an outlet port located on the cover, a pump, and a heat exchanger.

11. The power system as recited in claim 1, wherein the cover includes an inlet port configured to direct the coolant into the cooling channel.

12. The power system as recited in claim 11, wherein the coolant exits the terminal block assembly through a plurality of outlet nozzles arranged between the cover and the case body.

13. The power system as recited in claim 12, wherein the plurality of outlet nozzles are arranged on a bottom side of the case body.

14. The power system as recited in claim 12, wherein at least one outlet nozzle of the plurality of outlet nozzles is configured to allow the coolant to be gravity fed along a length of the bus bar.

15. An electrified vehicle comprising the power system of claim 1.

16. The power system as recited in claim 1, comprising a seal arranged for sealing an interface between the cover and the case body.

17. The power system as recited in claim 1, wherein a first end portion of the bus bar extends away from a bottom side of the case body and a second end portion of the bus bar extends away from a top side of the case body.

18. The power system as recited in claim 17, wherein the first end portion is connected to a stator lead of the first electrical component and the second end portion is connected to a sensor assembly of the second electrical component.

* * * * *